United States Patent
Vreenegoor et al.

(10) Patent No.: US 10,920,919 B2
(45) Date of Patent: Feb. 16, 2021

(54) INSPECTING A LENGTH OF PIPE, AND INSPECTION PIG

(71) Applicant: SHELL OIL COMPANY, Houston, TX (US)

(72) Inventors: Aloysius Johannes Nicolaas Vreenegoor, Amsterdam (NL); Rajneesh Varma, Houston, TX (US); Vipul Khosla, Amsterdam (NL)

(73) Assignee: SHELL OIL COMPANY, Houston, TX (US)

( * ) Notice: Subject to any disclaimer, the term of this patent is extended or adjusted under 35 U.S.C. 154(b) by 225 days.

(21) Appl. No.: 16/062,189

(22) PCT Filed: Dec. 16, 2016

(86) PCT No.: PCT/EP2016/081550
§ 371 (c)(1),
(2) Date: Jun. 14, 2018

(87) PCT Pub. No.: WO2017/103186
PCT Pub. Date: Jun. 22, 2017

(65) Prior Publication Data
US 2018/0363827 A1 Dec. 20, 2018

(30) Foreign Application Priority Data
Dec. 18, 2015 (EP) .................................. 15201397

(51) Int. Cl.
*F16L 55/26* (2006.01)
*G01R 33/00* (2006.01)
(Continued)

(52) U.S. Cl.
CPC .......... *F16L 55/26* (2013.01); *G01R 33/0005* (2013.01); *F16L 2101/30* (2013.01)

(58) Field of Classification Search
CPC ... F16L 55/26; F16L 2101/30; G01R 33/0005
See application file for complete search history.

(56) References Cited

U.S. PATENT DOCUMENTS

| | | | |
|---|---|---|---|
| 5,659,142 A | * | 8/1997 | Lima ....................... F16L 55/28 73/865.8 |
| 6,915,703 B2 | | 7/2005 | Haase et al. |

(Continued)

FOREIGN PATENT DOCUMENTS

| | | |
|---|---|---|
| DE | 102011007908 A1 | 10/2012 |
| GB | 2408340 A | 5/2005 |
| WO | 2014118425 A1 | 8/2014 |

OTHER PUBLICATIONS

International Search Report and Written Opinion received for PCT Patent Application No. PCT/EP2016/081550, dated Mar. 22, 2017, 8 pages.

(Continued)

*Primary Examiner* — Daniel S Larkin
*Assistant Examiner* — Anthony W Megna Fuentes

(57) ABSTRACT

A method of inspecting a length of pipe having a pipe wall and a nominal inner diameter, comprising providing an inspection pig configured for passing along the length of pipe, wherein the inspection pig is provided with a substantially circumferential inside-out capacitance tomography sensor arrangement having a diameter smaller than the nominal inner diameter; passing the inspection pig along the length of pipe thereby defining an annular space between the sensor arrangement and the pipe wall; conducting measurements using the sensor arrangement at a plurality of locations along the length of pipe, and deriving, for each of the plurality of locations, information about an interface surrounding the inspection pig from the measurements. Further provided is an inspection pig for inspecting a length of pipe, (Continued)

Figure 1:
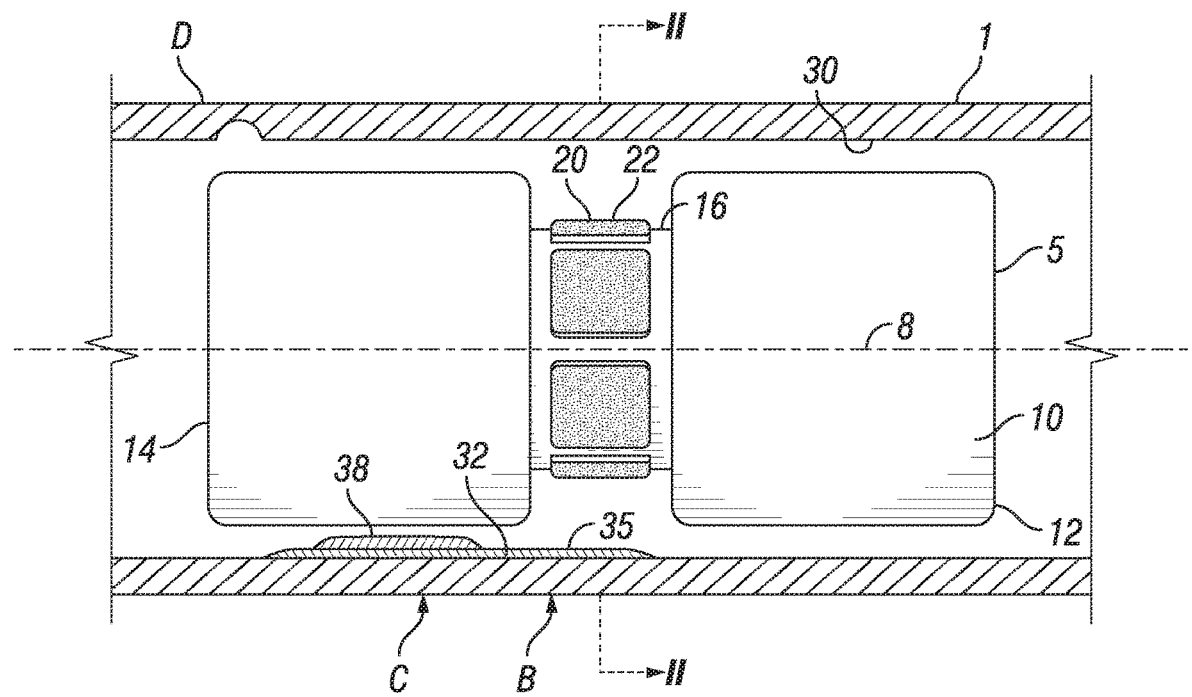

wherein the inspection pig is provided with an inside-out capacitance tomography sensor arrangement.

23 Claims, 2 Drawing Sheets

(51) Int. Cl.
*F17D 5/06* (2006.01)
*F16L 101/30* (2006.01)

(56) References Cited

U.S. PATENT DOCUMENTS

| | | | |
|---|---|---|---|
| 7,421,914 B2 | 9/2008 | Stanley et al. | |
| 2004/0261547 A1* | 12/2004 | Russell | G01N 29/11 73/865.8 |
| 2010/0307238 A1* | 12/2010 | Van Popta | G01N 27/225 73/335.04 |
| 2015/0355126 A1* | 12/2015 | Voutilainen | G01N 27/24 324/671 |

OTHER PUBLICATIONS

Rao et al., "Electrical Capacitance Tomography Measurements on the Pneumatic Conveying of Solids", Industrial and Engineering Chemistry Research, May 18, 2001, vol. 40, Issue No. 20, pp. 4216-4226, XP055277016.

Kjaersgaard-Rasmussen et al, "Inside-Out Electrical Capacitance Tomography", Flow Measurement and Instrumentation, Apr. 2011, vol. 22, Issue No. 2, 8 pages.

Kjaersgaard-Rasmussen et al., "Inside-out Electrical Capacitance Tomography for Downhole Multiphase Flow Evaluation", Technical University of Denmark, Department of Mechanical Engineering, Apr. 2010, 172 pages.

Asseln, "Pipeline Deposit Measurement Using Tracerco Diagnostics™ Technologies", Tracerco News, Apr. 27, 2009, vol. 3, Edition 1, 7 pages.

* cited by examiner

INSPECTING A LENGTH OF PIPE, AND INSPECTION PIG

CROSS REFERENCE TO RELATED APPLICATIONS

This is a national stage application of International Application No. PCT/EP2016/081550, filed 16 Dec. 2016, which claims benefit of priority to European Patent Application No. 15201397.5, filed 18 Dec. 2015.

FIELD OF THE INVENTION

The present invention relates to a method of inspecting a pipe section, and to an inspection pig.

BACKGROUND OF THE INVENTION

During the lifetime of a pipeline, it can be needed to inspect the pipeline. For example, during use of the pipeline deposits can be formed. In pipelines used in the oil- and gas-industry for transporting hydrocarbon containing fluids, fouling during use can for example lead to the formation of wax and/or asphaltene deposits. Inorganic deposits can also form, such as from the precipitation of salts (e.g. sulfates, sulfides, carbonates, silicates, fluorides), commonly referred to as "scale". Pipeline operators want to know the extent of fouling along the pipeline. For pipelines that are accessible from the outside, typically onshore on surface, it is possible to detect deposits on the inner pipe wall from the outside using radioactive inspection technologies, such as described in the paper "Pipeline Deposit Measurement Using TRACERCO Diagnostics™ Technologies", Tracerco News, Volume 3, Edition 1. Such inspection from the outside requires clamping, de-clamping, re-positioning re-clamped which is complex, tedious and expensive.

U.S. Pat. No. 7,421,914 describes an apparatus for detecting the physical condition of a tubular. The known apparatus, also referred to as inspection pig, comprises caliper assemblies capable of generating data representative of an interior surface of a tubular through which the apparatus is urged. As the apparatus travels through the tubular, the caliper arm assemblies respond to geometric anomalies or other changes in the configuration of the tubular. Electronic signals collected from the caliper arms is used to determine a variety of different and independent tubular factors such as debris, deposits, protrusions, joints and bends, the combination of which provide an overall tubular condition profile.

The known apparatus is mechanically complex and cannot distinguish between different factors influencing the tubular condition profile.

There is a need for an improved method of inspecting a pipe and an improved inspection pig.

SUMMARY OF THE INVENTION

In accordance with one aspect of the present invention there is provided a method of inspecting a length of pipe having a pipe wall and a nominal inner diameter, the method comprising providing an inspection pig configured for passing along the length of pipe, wherein the inspection pig is provided with a substantially circumferential inside-out capacitance tomography sensor arrangement having a diameter smaller than the nominal inner diameter; passing the inspection pig along the length of pipe thereby defining an annular space between the sensor arrangement and the pipe wall; conducting measurements using the sensor arrangement at a plurality of locations along the length of pipe, and deriving, for each of the plurality of locations, information about an interface surrounding the inspection pig from the measurements.

There is also provided a method of inspecting a length of pipe having a pipe wall and a nominal inner diameter, the method comprising providing an inspection pig configured for passing along the length of pipe, wherein the inspection pig is provided with a substantially circumferential inside-out capacitance tomography sensor arrangement having a diameter smaller than the nominal inner diameter; passing the inspection pig along the length of pipe thereby defining an annular space between the sensor arrangement and the pipe wall; conducting measurements using the sensor arrangement at a plurality of locations along the length of pipe, and deriving, for each of the plurality of locations, information about a deposit formed on an inner surface of the pipe wall.

In accordance with another aspect of the invention there is provided an inspection pig for inspecting a length of pipe, wherein the inspection pig is provided with an inside-out capacitance tomography sensor arrangement.

DETAILED DESCRIPTION OF THE INVENTION

The expression "inspection pig" is used herein to refer to an apparatus for moving or being moved through a length of pipe, such as a section of pipeline, during which travel measurements with respect to the pipe interior and/or the pipe are conducted. An inspection pig typically has elongated shape with a longitudinal axis normally substantially parallel or coinciding with the axis of the pipe to be inspected, and a diameter or cross-section allowing it to move along the length of pipe having a nominal diameter. It is possible that the inspection pig's circumference is flexibly constructed so that the diameter adapts to the inner cross-section of the pipe while moving along, accounting for disturbances, anomalies, deposits or the like causing deviation from the pipe's nominal diameter. The diameter that the inspection pig has or assumes when moving along a pipe is referred to herein as its effective diameter. It shall be clear that the inspection pig may in some embodiments be suitable and equipped for other purposes but inspection.

Applicant has realized that improved inspection of the interior of pipes is achieved with an inspection pig carrying an inside-out electrical capacitance tomography sensor assembly. The use of fixed electrical capacitance meters in oilfield applications is known for example for determining a flow property of a fluid flowing through a conduit, such as described in U.S. Pat. No. 6,915,703. Capacitance meters as used therein comprise a plurality of sensor electrodes circumferentially arranged around a conduit. Capacitances between any two single sensor electrodes are measured, wherein each capacitance measurement samples an average dielectric constant (permittivity) in the space in the interior of the conduit that is probed by the respective electrodes. Methods that provide an image based on a plurality of capacitance measurements are often referred to as capacitance tomography. Well known in the art are methods for calculating an image from the capacitances measured by such capacitance meter, for example linear back projection wherein the image is calculated by a series of linear operations on the capacitances. From the measurements an image of the conduit cross-section consisting of pixels can be constructed, wherein a pixel represents an average value of the dielectric constant in a discrete space element in the cross-section, the pixel data. Such an image can be transformed into a concentration image or a density image.

The article "Inside-out electrical capacitance tomography" by J. Kjærsgaard-Rasmussen and K. E. Meyer, Flow Measurement and Instrumentation 22 (2011) 104-109, describes measurement of a watercut in layered flows in an annular space formed by two concentric cylinders. Electrodes are placed circumferentially around an inner cylinder. The inner and outer tubes were grounded. Capacitances between pairs of electrodes are measured, probing the permittivity distribution in the annular space surrounding the electrode arrangement. The paper also describes how to construct an image from the capacitance measurements in the inside-out sensor arrangements. A smoothed Landweber algorithm was preferred as it was found to reduce artefacts compared to a linear backprojection algorithm.

In the present invention an inspection pig is provided with a substantially circumferential inside-out capacitance tomography sensor arrangement. Typically a number of electrodes are circumferentially arranged in a plane perpendicular to the longitudinal extension of the inspection pig. Suitably the electrodes are arranged in a substantially circular arrangement, wherein it will be understood that a circular arrangement can for example be approximated by a polygon. From 3 to 50 electrodes can for example be arranged, suitably from 4 to 24 electrodes, such as from 8 to 16 electrodes. The diameter of the electrode arrangement is suitably smaller than the nominal inner diameter of the pipe to be inspected, so that an annular space surrounding the sensor arrangement is formed during use. In some embodiments the main body of the inspection pig has an effective diameter smaller than the nominal inner diameter. In such case the inspection pig can optionally be centralized in the tube, using centralizer means that can be as known in the art, alternatively it can be allowed that pig's longitudinal axis is offset from the axis of the inspected pipe. In some embodiments the main body of the inspection pig has an effective diameter equal to or only slightly smaller than the nominal inner diameter of the pipe to be inspected, wherein the inside-out sensor arrangement is arranged in a section having a diameter smaller than the effective diameter.

In some embodiments the main body of the inspection pig can be a so-called foam pig.

Figure 2:
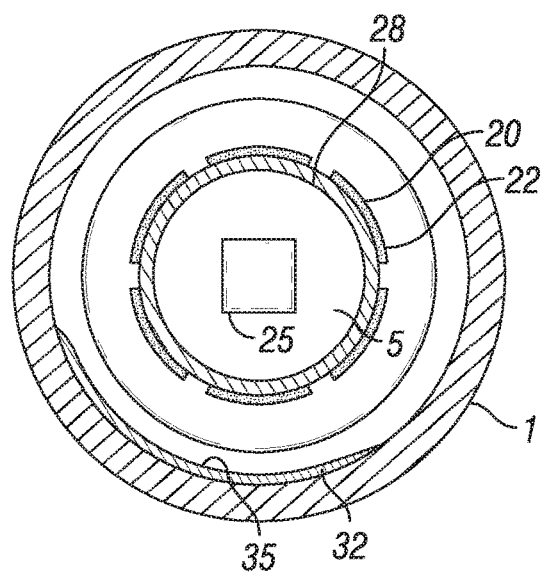
Figure 3A:
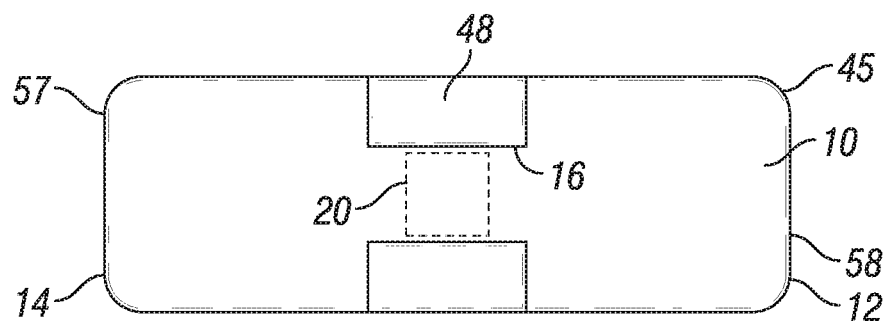

The invention shall now be further described by way of example and with reference to the drawings, wherein FIG. 1 schematically shows an inspection pig in a length of pipe in accordance with the invention, in longitudinal cross-section;

FIG. 2 shows the inspection pig in the length of pipe as per FIG. 1, in a cross-sectional cut along line II-II; and FIGS. 3a,b schematically show further embodiments of an inspection pig in accordance with the invention.

Where like reference numerals are used in the Figures, they refer to the same or similar elements when they carry the same number.

Reference is made to FIGS. 1 and 2, schematically showing a length of pipe 1 with therein an inspection pig 5 in accordance with the invention. The length of pipe can be a pipeline as for the transport of fluids in oil- and/or gas production, for example multiphase fluids comprising crude oil, natural gas and/or other gaseous components, and/or water. The pipe can also be a pipeline, e.g. for the transport of refined petroleum products, or another pipe shaped conduit such as a flowline, piping, riser, jumper, furnace tube or slug-catcher, or other conduits prone to deposition, fouling, corrosion, deformation and deterioration. The pipe is typically cylindrical, but in principle conduits of non-circular cross-section can also be inspected. The length of pipe can be located onshore, offshore (shallow water or deep water), buried or non-buried, or combinations thereof. Normally the length of pipe has an axis 8 and a circular cross-section. The pipe can be cladded or provided with a liner (not shown). Typically the pipe is metallic such as from steel, but it can also be non-metallic. A metallic pipe can be grounded during the inspection measurements.

The length to be inspected can vary widely with the application and object being inspected, and can for example be 1 meter or more, 20 meters or more, 100 meters or more, or 1 km or more. Very long lengths up to, say, 100 km are possible in principle, or even more.

The diameter of the pipe can be typically 5 cm or more, in particular 10 cm or more. There is no fixed upper limit, and up to 10 m or even more would be possible.

While the invention can operate with a variety of types of inspection pigs, in the embodiment as shown the main body 10 of the inspection pig 5, that is supporting the capacitance tomography sensor arrangement, is a foam pig. The inspection pig 5 in this example has an elongated shape, having an axis normally coinciding with the axis 8. The inspection pig has an upstream end 12 (tail) and a downstream end 14 (nose). Upstream and downstream ends have an effective diameter that can be substantially equal, and which in this example is smaller than the nominal diameter of pipe 1. Moving such inspection pig along the pipeline does not scrape deposits off the wall. Even if a large amount of deposits is encountered, the foam pig body can deform somewhat to assume a smaller effective diameter. An additional advantage of a foam pig body is that it will disintegrate (and can thus be disintegrated by an operator if desired) if a certain pressure drop across the inspection pig is applied that is higher than the maximum pressure drop that the inspection pig can withstand, for example a pressure drop of from 2 to 10 bar, typically from 3 to 5 bar. A foam inspection pig has thus a relatively low risk of getting stuck in a pipeline compared to other inspection pigs, which is an advantage for inspecting pipelines of which the amount of potential deposits is not known in advance.

In an annular recess section 16 between upstream and downstream ends 12,14, an inside-out capacitance tomography sensor arrangement 20 is provided in this embodiment. The sensor arrangement in this example comprises 8 electrodes 22. The electrodes 22 in the example of FIG. 1 are arranged on the outer surface of the annular recess 16, however, they may also be arranged in the wall thereof, and they may be covered by a protecting material (not shown). Preferably, all electrodes have the same size and shape and are symmetrically arranged. A control/power unit 25 is provided, suitably connected to the electrodes 22. An inner metal shield 28 can be provided and can be grounded.

During normal operation the inspection pig 5 is introduced into the length of pipe from a pig launcher and moved along the pipeline. It can be self-propelling, it can be moved pneumatically or hydraulically such as with the flow of fluid in the pipe, or it can be mechanically pushed or drawn using a wireline, or it can move along with the flow. In some operations it is advantageous that the inspection pig can move in a stream of multiphase fluid (e.g. liquid hydrocarbon (for example crude oil) and/or water and/or gas, such as oil/water, oil/gas, or oil/water/gas), and in some embodiments be propelled by the multiphase hydrocarbon production, and thus the various interfaces and deposits can be detected while minimizing production deferment. For comparison, acoustic measurement techniques, such as ultrasound, require the sensor to be submerged in a liquid and would not give reliable measurements in a pipe in presence of a gas, in particular in multiphase production conditions, notably when comprising gas.

Measurements are being conducted using the sensor arrangement at a plurality of locations along the length of pipe. To this end, a set of measurement capacitors is selected, wherein a measurement capacitor is formed by two measurement electrodes, and wherein a measurement electrode consists either of a single sensor electrode 22 or of at least two interconnected sensor electrodes 22. For each of the selected set of measurement capacitors a value related to a capacitance is measured, repeatedly while the inspection pig moves along the length of pipe. While a continuous measurement has particular advantages, and the inspection pig does not need to stop to measure a full radial distribution of deposition layers at a given location of the pipeline, it is in some embodiments also possible to stop the inspection pig at discrete locations and conduct all capacitance measurements at the same location. The inspection pig is suitably equipped with localization means such as an odometer and rotation sensor so that the location and orientation for a particular measurement are recorded. The measured data are suitably stored in on-board memory for later processing, but it is also possible to process them on board of the inspection pig or to transmit them to an external processing unit.

From the measured data, for each of the plurality of locations, information about an interface in the surrounding of the inspection pig is derived from the measurements. This can be achieved in various ways. An image reconstruction can be conducted substantially as described in the article "Inside-out electrical capacitance tomography" cited above and the thesis "Inside-out electrical capacitance tomography for downhole multiphase flow evaluation" by J. Kjærsgaard-Rasmussen, Technical University of Denmark, Department of Mechanical Engineering, April 2010. It is possible to obtain a three-dimensional mapping of the inside of a pipeline with the moving inspection pig. While it may be preferable, it is not always necessary to construct full images in three dimensions, rather discrete two-dimensional image in the plane of the sensor arrangement at selected locations can suffice. Even a one-dimensional (such as radial) reconstruction at several locations can be sufficient as an indication of an interface. Alternatively, the measurements can be compared at a particular location in the pipe with calibration measurements or model calculations, and from the deviation information about the interface can be inferred for that location.

At a location where the pipe is unobstructed by deposits and where the pipe wall is without defects, such as location A, the measurements shall indicate the normal inner wall 30 as the interface. At a location B, where there is a deposit 32 of a certain chemical nature (e.g. scale, wax, asphaltene, sand) with a certain layer thickness, information about one or more of several parameters of interest can be derived: the position of the inner interface 35, the position of the inner wall at that location and thereby the thickness of the deposit layer, and/or the nature of the layer. In some instances it can be possible that several layers of different nature are formed as at C, and in that case there are several interfaces that can be detected. A particular deposit can extend merely along a certain distance, or along several intervals along the inner circumference of the pipe, for example at the bottom of the pipeline, or at the top, and an estimate of such distance or intervals (or e.g. equivalent angular section(s)), and/or of the angular position(s) where such deposit is formed can also be, or form part of, the information derived about the interface. A particular deposit can extend merely for a certain longitudinal distance, or longitudinal intervals, and an estimate of such longitudinal distance or intervals, and/or of the position(s) along the length of pipe where such deposits are formed can also be, or form part of, the information derived about the interface. It shall be understood that deposition can form complex structures with varying presence, thickness, extension around the circumference and in longitudinal direction, and there can be more than one type of deposit involved. In one embodiment the information derived about the interface is used to construct an image of deposits in a cross-section of the pipe and/or along a distance along the length of pipe.

The interpretation of the measurements can also indicate the presence of a defect in the wall (or a liner, if present; not shown) as at D, where in this example the interface with the pipe interior is shifted due to corrosion. Likewise, interface deformations or deteriorations such as buckles, dents, holes, cracks, corrosion defects, liner defects, deviations from a circular shapes, etc., can be detected.

Figure 3B:
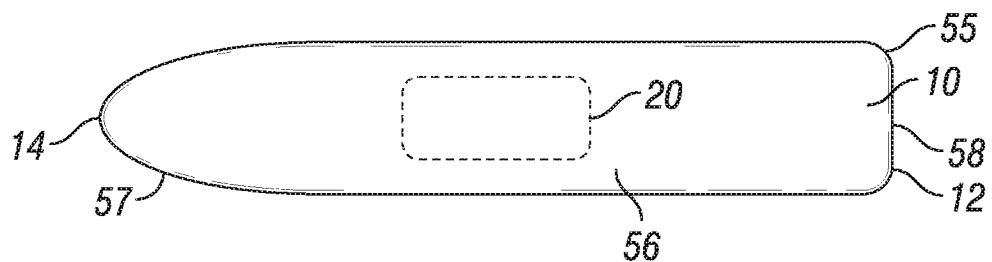

With an inside-out capacitance tomography sensor arrangement having a diameter smaller than the inner diameter of the length of pipe, it is also possible that the sensor arrangement is covered by a material that is at least partially electromagnetically transparent. Such a configuration is schematically shown in FIGS. 3a and 3b. In FIG. 3a the annular recess region 16 of a pig 45 similar to the one described in FIG. 1 is covered by such material 48. In FIG. 3b the inspection pig has a hull 56 formed of such material, e.g. an outer foam sheath. In both cases the inspection pig has a substantially uniform diameter between a nose 57 and a tail 58. A material that is at least partially electromagnetically transparent permits inside-out capacitance tomography measurements to be conducted for a region outside, i.e. through such material, with acceptable damping from the material. Foam such as used for form pigs can be a suitable such material.

In some embodiments, the material surrounding the capacitance sensors provides a contrast in the measurements. That can be used for deriving information about the interface of the material with its surroundings. For example, when the material is elastic such as foam and snugly fits in the nominal inner diameter of the pipe, moving the pig along the pipe when deposits are present will cause a compression/decompression of the material, which can be detected and analysed by the capacitance tomography measurements. The measurements and their interpretation can focus on measuring the compression in the material which gives indirect information about the interface with the inner wall, and/or can focus directly on the interface between the material and the inner wall.

In some embodiments it may be advantageous that the inspection pig is surrounded by a contrast fluid, at least in a region around the inside-out capacitance tomography sensor arrangement. A contrast fluid is a fluid providing a contrast with the inner surface of the pipe to be inspected, which may be formed by deposits. This can be advantageous when the fluid normally contained in the pipeline provides no or insufficient contrast in the capacitance tomography measurements, for example a hydrocarbon liquid could form insufficient contrast with a waxy deposit. A suitable contrast fluid can for example be water or brine. Another suitable contrast fluid can be a mixture of hydrocarbon liquid and water or brine and optionally a stabilizing agent such as a surfactant, containing between 1 and 99 wt % water or brine based on total fluid, suitably 2-20 wt % water or brine, such as 5-10 wt %. Even a relatively low water cut can significantly increase the contrast at the interface with the surrounding pipe inner surface. The contrast fluid can for example be introduced as a small slug just before, during and after introducing the inspection pig into the pipe. Normally a small addition of water to a hydrocarbon transporting pipeline would not require a special treatment downstream. The present invention also provides a method of inspecting a length of pipe having a pipe wall and a nominal inner diameter, the method comprising providing an inspection pig configured for passing along the length of pipe, wherein the inspection pig is provided with a substantially circumferential inside-out capacitance tomography sensor arrangement having a diameter smaller than the nominal inner diameter; passing the inspection pig along the length of pipe thereby defining an annular space between the sensor arrangement and the pipe wall; conducting measurements using the sensor arrangement at a plurality of locations along the length of pipe, and deriving, for each of the plurality of locations, information about a deposit formed on an inner surface of the pipe wall.

The information about the deposit derived with any of the methods of the present invention can comprise one or more of: a longitudinal position, a longitudinal extension, a longitudinal distribution, a circumferential position, a circumferential extension, a circumferential distribution, a thickness, a thickness distribution along at least part of the circumference of the pipe and/or along a distance along the pipe, an indication of the type of deposit, an indication of the presence of more than one type of deposit.

The person skilled in the art will readily understand that, while the invention is illustrated making reference to one or more specific combinations of features and measures, many of those features and measures are functionally independent from other features and measures such that they can be equally or similarly applied independently or in combination in other embodiments of the invention.

That which is claimed is:

1. A method of inspecting a length of pipe having a pipe wall and a nominal inner diameter, the method comprising—providing an inspection pig configured for passing along the length of pipe, wherein the inspection pig is provided with a substantially circumferential inside-out capacitance tomography sensor arrangement having a diameter smaller than the nominal inner diameter of the pipe; —passing the inspection pig along the length of pipe thereby defining an annular space between the sensor arrangement and the pipe wall; —conducting measurements using the sensor arrangement at a plurality of locations along the length of pipe, and —deriving, for each of the plurality of locations, information about an interface surrounding the inspection pig from the measurements, wherein the information about the interface comprises an indication of the nature of at least one layer forming the interface with another layer.

2. The method of claim 1, wherein the information about the interface comprises an indication of a position of the interface.

3. The method of claim 1, wherein at least part of the measurements are conducted while the inspection pig is moving along the length of pipe.

4. The method of claim 1, wherein a fluid comprising gas is present in the length of pipe.

5. The method of claim 1, wherein a multiphase fluid is present in the length of pipe.

6. The method of claim 1, wherein passing the inspection pig along the length of pipe comprises moving the inspection pig along the length pipe by a flow of fluid along the pipe.

7. The method of claim 1, wherein the interface comprises an interface of a deposit on the pipe wall.

8. The method of claim 7, wherein deriving information about the interface comprises deriving information about the deposit, the information about the deposit comprising one or more of: a longitudinal position, a longitudinal extension, a longitudinal distribution, a circumferential position, a circumferential extension, a circumferential distribution, a thickness, a thickness distribution along at least part of the circumference of the pipe and/or along a distance along the pipe, an indication of the type of deposit, and/or an indication of a presence of more than one type of deposit.

9. The method of claim 1, wherein a contrast fluid is provided at least in a region between the inside-out capacitance tomography sensor arrangement and the pipe wall.

10. The method of claim 1, wherein the inside-out capacitance tomography sensor arrangement is covered by a material providing a contrast in the measurements, and wherein the method further comprises deriving information about the interface based on the measurements containing the material provided contrast.

11. The method of claim 1, wherein deriving information about the interface further comprises an indication of a presence of a defect in the wall of the pipe, a defect in a liner of the pipe, an interface deformation, an interface deterioration, and combinations thereof.

12. The method of claim 11, wherein the interface deformation and interface deterioration comprises a buckle, a dent, a hole, a crack, a corrosion defect, a liner defect, a deviation from a circular shape, and combinations thereof.

13. A method of inspecting a length of pipe having a pipe wall and a nominal inner diameter, the method comprising—providing an inspection pig configured for passing along the length of pipe, wherein the inspection pig is provided with a substantially circumferential inside-out capacitance tomography sensor arrangement having a diameter smaller than the nominal inner diameter of the pipe; —passing the inspection pig along the length of pipe thereby defining an annular space between the sensor arrangement and the pipe wall; —conducting measurements using the sensor arrangement at a plurality of locations along the length of pipe, and —deriving, for each of the plurality of locations, information about an interface surrounding the inspection pig from the measurements, wherein the inside-out capacitance tomography sensor arrangement is covered by a material providing a contrast in the measurements, and wherein the method further comprises deriving information about the interface based on the measurements containing the material provided contrast.

14. The method of claim 13, wherein the information about the interface comprises an indication of a position of the interface.

15. The method of claim 13, wherein at least part of the measurements are conducted while the inspection pig is moving along the length of pipe.

16. The method of claim 13, wherein a fluid comprising gas is present in the length of pipe.

17. The method of claim 13, wherein a multiphase fluid is present in the length of pipe.

18. The method of claim 13, wherein passing the inspection pig along the length of pipe comprises moving the inspection pig along the length pipe by a flow of fluid along the pipe.

19. The method of claim 13, wherein the interface comprises an interface of a deposit on the pipe wall.

20. The method of claim 19, wherein deriving information about the interface comprises deriving information about the deposit, the information about the deposit comprising one or more of: a longitudinal position, a longitudinal extension, a longitudinal distribution, a circumferential position, a circumferential extension, a circumferential distribution, a thickness, a thickness distribution along at least part of the circumference of the pipe and/or along a distance along the pipe, an indication of the type of deposit, and/or an indication of a presence of more than one type of deposit.

21. The method of claim 13, wherein a contrast fluid is provided at least in a region between the inside-out capacitance tomography sensor arrangement and the pipe wall.

22. The method of claim 13, wherein deriving information about the interface comprises an indication of a presence of a defect in the wall of the pipe, a defect in a liner of the pipe, an interface deformation, an interface deterioration, and combinations thereof.

23. The method of claim 22, wherein the interface deformation and interface deterioration comprises a buckle, a dent, a hole, a crack, a corrosion defect, a liner defect, a deviation from a circular shape, and combinations thereof.

* * * * *